United States Patent [19]

Cho et al.

[11] Patent Number: 4,534,103
[45] Date of Patent: Aug. 13, 1985

[54] METHOD OF MAKING SELF-ALIGNED METAL GATE FIELD EFFECT TRANSISTORS

[75] Inventors: Alfred Y. Cho, Summit; Bernard Glance, Colts Neck, both of N.J.; Daniel Lubzens, Haifa, Israel; Martin V. Schneider, Holmdel, N.J.

[73] Assignee: AT&T Bell Laboratories, Murray Hill, N.J.

[21] Appl. No.: 392,286

[22] Filed: Jun. 25, 1982

Related U.S. Application Data

[62] Division of Ser. No. 119,313, Feb. 7, 1980, abandoned.

[51] Int. Cl.³ .......................................... H01L 21/302
[52] U.S. Cl. ..................................... 29/571; 29/578; 29/580; 148/187
[58] Field of Search ........................ 29/571, 578, 580; 148/187

[56] References Cited

U.S. PATENT DOCUMENTS

| | | | |
|---|---|---|---|
| 3,258,663 | 6/1966 | Weimer | 357/15 |
| 3,287,611 | 11/1966 | Bockemuehl et al. | 357/22 |
| 3,385,731 | 5/1968 | Weimer | 357/15 |
| 3,930,912 | 1/1976 | Wisbey | 29/580 X |
| 4,160,984 | 7/1979 | Ladd et al. | 357/22 |
| 4,226,649 | 10/1980 | Davey et al. | 29/571 X |
| 4,247,373 | 1/1981 | Shimano et al. | 29/571 X |
| 4,266,333 | 5/1981 | Reichert | 29/571 |
| 4,317,125 | 2/1982 | Hughes et al. | 29/590 X |

Primary Examiner—George T. Ozaki
Attorney, Agent, or Firm—David I. Caplan

[57] ABSTRACT

A metal gate field effect transistor has its source and drain located on one major surface of a gallium arsenide layer, while its gate electrode forms a Schottky barrier contact to an opposed major surface of the layer in a self-aligned relationship to the source and drain.

5 Claims, 7 Drawing Figures

METHOD OF MAKING SELF-ALIGNED METAL GATE FIELD EFFECT TRANSISTORS

CROSS-REFERENCE TO RELATED APPLICATIONS

This application is a division of application Ser. No. 119,313, filed Feb. 7, 1980 now abandoned.

FIELD OF THE INVENTION

This invention relates to semiconductor apparatus, and more particularly to self-aligned metal gate field effect transistors.

BACKGROUND OF THE INVENTION

Metal gate field effect transistor (MESFET) device structures are known in the art. These MESFET devices typically include spaced apart source and drain and gate electrodes on a major surface of a semiconductor layer, typically of epitaxial gallium arsenide. The source and drain electrodes make ohmic contact to the semiconductor layer while the gate electrode makes a Schottky barrier contact thereto between the source and drain electrodes, thereby defining a channel region therebetween. The gate electrode is adapted to receive a control signal voltage, in order to modulate the electrical conductance of the channel region and thus control the flow of electrical current between the source and drain electrodes. Such devices are useful as electrical switches and amplifiers.

A problem associated with these MESFET devices in the prior art stems from the source to gate electrode spacing and the gate to drain electrode spacing, as required for electrically insulating the gate electrode from both source and drain electrodes. These spacings give rise to undesirable parasitic series resistances associated with both source to gate and gate to drain paths; thereby both the transconductance and the maximum available output power of the device are degraded, particularly at the high operating frequencies of microwaves (3 to 30 gigahertz).

SUMMARY OF THE INVENTION

In order to reduce the parasitic resistance in a MESFET structure, the gate electrode is located on a major surface of a semiconductor layer on the opposite side from that on which the source and drain electrodes are located, in a self-aligned configuration. More specifically, this invention involves a metal gate field effect transistor device structure comprising a first semiconductor layer having first and second mutually parallel opposed major surfaces, source and drain electrodes being in ohmic contact with, respectively, source and drain regions contiguous with said first major surface, and having a gate electrode to control the flow of current between the source and drain regions, CHARACTERIZED IN THAT said gate electrode is a Schottky barrier contact to the second, major surface of the semiconductive layer, said contact being aligned, with an accuracy of a wavelength in the ultraviolet region of the optical spectrum, to the respective orthogonal projections of the mutually near edges of the source and drain electrodes onto said second major surface.

BRIEF DESCRIPTION OF THE DRAWINGS

This invention together with its features, objects, and advantages may be better understood from the following detailed description when read in conjunction with the drawings in which.

DETAILED DESCRIPTION

Figure 6:
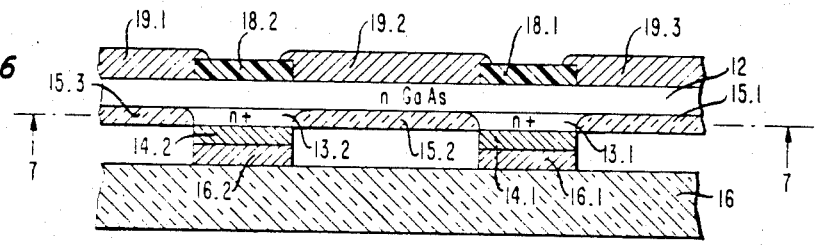
FIG. 6 is a cross section diagram of a thin film, self-aligned metal gate field effect transistor device in accordance with a specific embodiment of the invention.
Figure 7:
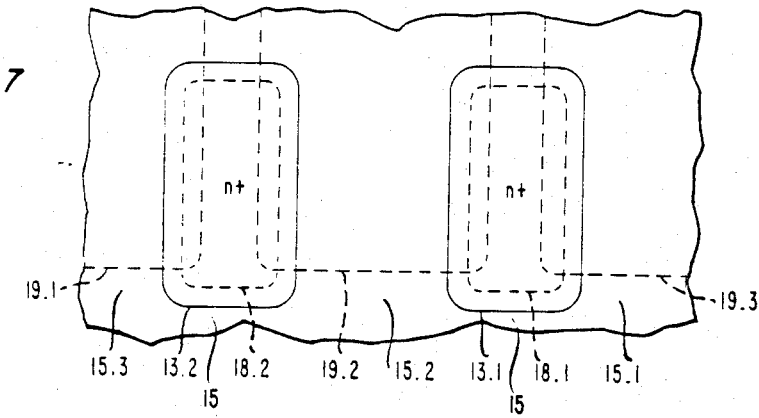
FIG. 7 is a section of the device shown in FIG. 6.

As illustrated in FIG. 6, a thin film, self-aligned MESFET structure includes an electrically insulating, transparent support body 16, for example, a crystalline slab of diamond, sapphire, or fused quartz. A pair of spaced apart electrode bonding pads 16.1, 16.2 are located on the top major surface of the support 16. Bonded to this pair of pads is a corresponding pair of electrodes 14.1, 14.2, suitable for forming ohmic contacts to a corresponding pair of n+ semiconductor zones 13.1, 13.2. The thickness of each such electrode plus its bonding pad is advantageously at least about a penetration ("skin") depth of the operating electromagnetic frequency, in order to minimize loss. The n+ zones 13.1, 13.2 are mutually electrically insulated by an insulator layer 15 (FIG. 7). This insulating layer can be conveniently thought of as subdivided into an intermediate insulating region 15.2, located between the n+ zones, and a pair of peripheral insulating regions 15.1, 15.3 (FIGS. 6 and 7). Each of the n+ zones 13.1, 13.2 makes contact with a different portion of a thin film semiconductor layer 12 of n-type semiconductor conductivity type. A pair of insulating layer regions 18.1 and 18.2, have their mutually near edges aligned, within an ultraviolet wavelength, to the orthogonal projections of the electrodes 14.1 and 14.2, respectively. These edges of the insulating regions 18.1 and 18.2 define the extremities of a Schottky barrier contact made by a gate electrode 19.2 on the top surface of the thin film semiconductor layer 12. Additional metallizations 19.1 and 19.3 are optional, and are useful in conjunction with further electrical devices (not shown) and their interconnections.

By virtue of the use of diamond as the mechanical support 16 instead of gallium arsenide, which is of higher thermal resistivity, the heat sink problem associated with the conventional microwave Ga As FET (gallium arsenide field effect transistor) is alleviated in this invention.

In a typical example of a GaAsFET device suitable for millimeter wave application, by way of illustration only, the body 16 is a slab of fused quartz having a thickness of about 250 microns. The electrode pads 16.1 and 16.2 are separated by a distance in the range of about 0.5 to 1 micron, each such pad being a gold strip having a length of about 50 microns, a width of about 10 micron, and a thickness of about 5 microns. The electrodes 14.1 and 14.2 are metal alloy strips having a thickness of about 2 microns. The semiconductor layer 12 is a thin film parallel plate of n-type semiconductive gallium arsenide, characterized by a thickness of about 0.3 micron and an excess significant donor impurity concentration of about $10^{17}$ atoms per $cm^3$. The n+ zones 13.1 and 13.2 are about 0.2 micron thick and contain an excess significant donor impurity concentration of about $10^{18}$ atoms per $cm^3$. Advantageously, these n+ zones are epitaxial with respect to the n layer 12. The insulating layer 15 is gallium oxide which has been formed by oxidation of epitaxial gallium arsenide of the same thickness as that of the n+ zones 13.1 and 13.2. The gate electrode 19.2, as well as the optional metallizations 19.1 and 19.3, is nickel or aluminum which forms Schottky barrier contact with the n layer 12.

Figure 1:
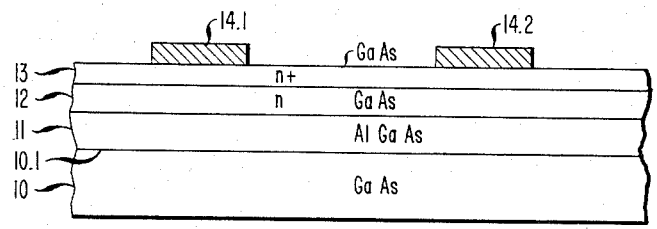
FIGS. 1–5 illustrate various successive stages of fabrication of the device shown in FIG. 6 in accordance with a specific embodiment of the invention.
Figure 2:
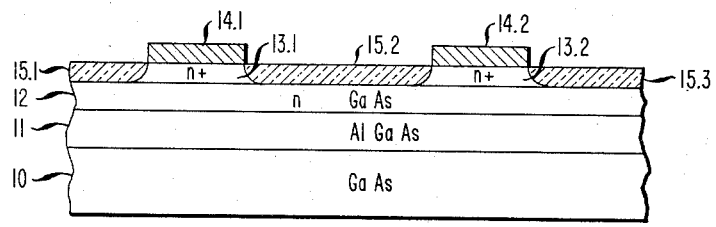

A convenient method for making this GaAsFET device is as follows. Upon the major surface 10.1 of the body gallium arsenide 10 are successively epitaxially grown a layer 11 of aluminum gallium arsenide ($Al_x$-$Ga_{1-x}As$), a layer 12 of n− type semiconductive gallium arsenide, and a layer 13 of n+ type (strongly n-type) gallium arsenide (FIG. 1). Present-day techniques of liquid phase epitaxy or molecular beam epitaxy may be used for these epitaxial growth steps. The body 10 is typically about 300 microns thick, sufficient to provide a convenient substrate or base for epitaxial growth on a major surface thereof. The layer 11 of $Al_xGa_{1-x}As$ has a thickness which is typically in the range of about 2 to 4 microns, while the mole fraction x of aluminum is advantageously in the range of about 0.35 to 0.75. The n-type layer 12 contains an excess significant donor impurity concentration of typically about $10^{17}$ atoms per $cm^3$, and has a thickness typically in the range of about 0.2 to 0.4 micron. The n+ layer 13 contains an excess significant donor impurity concentration of typically greater than about $1 \times 10^{18}$ atoms of tin (Sn) per $cm^3$, and has a thickness typically in the range of about 0.1 to 0.3 micron. In any event, this thickness advantageously is less than the thickness of the n layer 12. Metal strips are formed by alloying, at a temperature of about 400 degrees C., successive layers of SnNi, Ni, and gold; or by alloying eutectic gold-germanium. Next, the then still exposed portions of the layer 13 are oxidized, typically by electroless anodization in ultraviolet light, or by RF plasma oxidation, or by electrical anodization. Thereby, oxide regions 15.1, 15.2, 15.3 (FIG. 2) are formed in the original n+ layer 13 down to the top of the n layer 12, or slightly deeper, whereby n+ region 13.1 and 13.2 remain in the original layer 13 located underneath the metal strips 14.1 and 14.2, respectively. These n+ regions 13.1 and 13.2 serve as source and drain regions, respectively, of the completed MESFET device structure.

Figure 3:
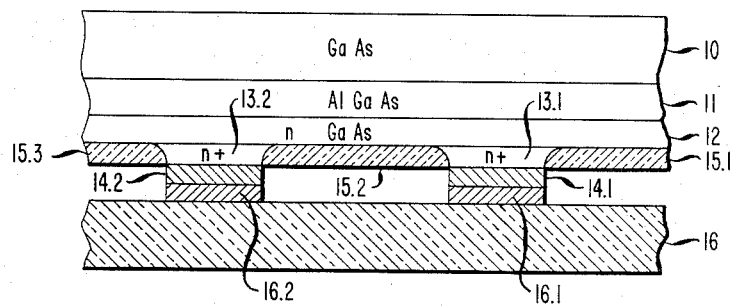

As indicated in FIG. 3, thee metal strips 14.1, 14.2 are then thermally bonded or soldered to corresponding metallic gold strip pads 16.1, 16.2. These pads are located on an insulating, transparent rigid body 16, typically a fused quartz slab. The thickness of each of these gold strips 16.1, 16.2 plus each of the corresponding metal strips 14.1, 14.2 is sufficient for opacity to ultraviolet light, and is advantageously approximately equal to the skin depth of the electromagnetic radiation to be controlled by the device, typically about 0.5 micron for control of millimeter waves.

Figure 4:
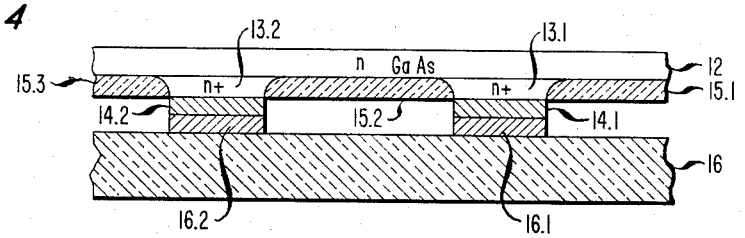

Next, the body 10 and the layer 11 are removed; thereby, a major surface of the n layer 12 becomes exposed (FIG. 4). This removal step can be performed by first mechanically lapping off the body 10 and then applying a selective etching solution which etches away the layer 11 but not the layer 12. Such as an etching solution can be, for example, a water solution of HF, or of iodine plus potassium chloride. As an alternative to the mechanical lapping, the body 10 itself can first be etched away by a water solution of hydrogen peroxide and ammonium hydroxide with a pH of about 7.02.

Figure 5:
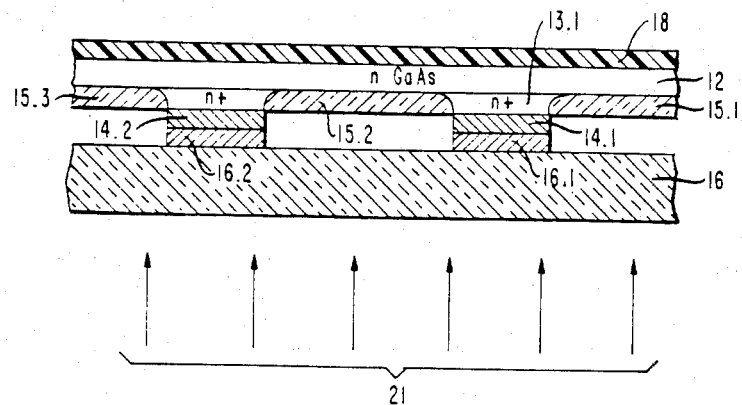

Next, as indicated in FIG. 5, an insulating positive photoresist layer 18 is applied to the then exposed major surface of the n-type GaAs layer 12. By "positive photoresist" is meant that kind of radiation sensitive material which dissolves in a suitable chemical developer solution in that region of the material where optical radiation was previously incident but which does not dissolve in the shadow regions where the optical radiation was not incident thereon. The optical radiation is supplied by an ultra-violet optical beam 21. This optical beam is directed in a direction perpendicular to the major surfaces of the layer 12 through both the transparent insulating body 16, the oxide regions 15.1, 15.2, 15.3, and the n layer 12 itself onto the photoresist layer 18. For purposes of high resolution, the optical wavelength of the beam 21 is in the range of about 3000 to 4000 angstroms. The metal strips 14.1, 14.2 thereby cast their geometric shadows on the photoresist. Then the photoresist is chemically treated with a developing solution that dissolves away the material of the photoresist only in those regions which were previously illuminated by the optical beam 21 but not in the shadow regions of the metal strips 14.1, 14.2; thereby the surface of the n layer 12 becomes exposed in the regions complementary to these shadow regions while portions 18.1 and 18.2 of photoresist remain intact on the surface of the n layer 12. Then a pulse electroplating process, typically with nickel, applies electrode metallizations 19.1, 19.2, 19.3 to the exposed regions of the n layer 12 (FIG. 6). Alternatively, an evaporation process, typically with aluminum, can be used for this purpose. In particular, in any event, the electrode 19.2 will thus be self-aligned, and is therefore useful as a gate electrode with respect to n+ regions 13.1 and 13.2 as source and drain, respectively, in a MESFET structure. The alignment of the gate electrode 19.2 with respect to the orthogonal projections of the source and drain regions will thus be to within less than about a wavelength of the UV beam 21, i.e., the UV optical resolution limit, plus the relatively slight transverse spreading or undercutting of the source and drain regions produced during their etching (FIG. 1–FIG. 2), depending upon type of etching solution and conditions used.

It should be noted that because of the removal of the relatively thick semiconductor body 10, the device shown in FIG. 6 does not suffer from the problem associated with the electrical parasitics of the thick gallium arsenide semiconductor material.

Although the invention has been described in detail in terms of a specific embodiment, various modifications can be made without departing from the scope of the invention. For example, many similar MESFET devices can simultaneously be fabricated in a single layer, in accordance with mass fabrication techniques; and these devices may then be electrically interconnected by thin film conductors, as known in the art. Moreover, instead of gallium arsenide, semiconductive silicon or $In_xGa_{1-x}As$ may be used, and p-type conductivity semiconductors may be used instead of n-type. Also, instead of oxidizing portions of the n+ layer 13 to form oxide regions 15.1, 15.2 and 15.3, these portions can be etched off, in order to expose the n layer 12 which can then be oxidized to a limited depth. In order to avoid the tendency of cracking of the relatively fragile structure shown in FIG. 4, it may be advantageous to etch grooves in the structure shown in FIG. 1; for example, geometrically selective (masked) chemical etching, laser cutting, reactive ion etching, or slicing with a diamond wheel can be used to cut grooves around each MESFET device or group of devices to be fabricated, each groove penetrating through the layers 13 and 12 down to the layer 11 or through a portion of the layer 11.

We claim:

1. In a process for making a semiconductor device, the steps of:
   (a) forming an opaque electrode on a first portion of a first major surface of a transparent semiconductor layer;
   (b) oxidizing the semiconductor layer to a limited depth at a second, complementary portion of the major surface of the semiconductor layer;
   (c) bonding said electrode onto a thin metal pad located on a major surface of a transparent insulating body; and
   (d) directing optical radiation, through both the insulating body and the oxidized portions of the semiconductor layer, to a positive photoresist layer located on a second opposed major surface of said semiconductor layer.

2. A process for fabricating semiconductor apparatus including a metal gate field effect transistor device comprising the steps of:
   (a) successively growing first and second epitaxial layers of semiconductor on a major surface of a base, the second layer characterized by a higher electrical conductivity than that of the first;
   (b) forming a pair of spaced apart opaque electrodes on a pair of separate first portions of the exposed major surface of the second epitaxial layer;
   (c) oxidizing the second epitaxial layer at second, complementary portions, whereby a source region and a drain region remain in the second epitaxial layer each contiguous with a different one of the separate first portions;
   (d) attaching said electrodes to bonding pads on a transparent, insulating, rigid body;
   (e) removing said base to expose a major surface of the first epitaxial layer;
   (f) directing a beam of ultraviolet optical radiation through both the rigid body, the said oxidized portions of the second epitaxial layer, and the first epitaxial layer onto a radiation sensitive layer on the exposed major surface of said first epitaxial layer;
   (g) removing those regions of the radiation sensitive layer upon which the optical beam was incident, thereby exposing the corresponding regions of first epitaxial layer; and
   (h) forming a gate electrode layer in Schottky barrier contact with said first epitaxial layer at the then exposed regions thereof.

3. The process of claim 2 in which the base is essentially a relatively thin layer of aluminum gallium arsenide located on a major surface of a body of gallium arsenide.

4. The process of claim 3 in which the atomic fraction of aluminum in the thin layer is in the range of about 0.35 to 0.75.

5. The process of claim 3 in which the first and second layers are essentially gallium arsenide.

* * * * *